US011906554B2

United States Patent
Zurek et al.

(10) Patent No.: US 11,906,554 B2
(45) Date of Patent: Feb. 20, 2024

(54) METER FOR MEASURING AN ELECTRICAL PARAMETER

(71) Applicant: Megger Instruments Ltd., Dover (GB)

(72) Inventors: Stanislaw Zurek, Dover (GB); Jeffrey Jones, Dover (GB)

(73) Assignee: Megger Instruments Ltd., Dover (GB)

( * ) Notice: Subject to any disclaimer, the term of this patent is extended or adjusted under 35 U.S.C. 154(b) by 0 days.

(21) Appl. No.: 18/078,426

(22) Filed: Dec. 9, 2022

(65) Prior Publication Data

US 2023/0106981 A1 Apr. 6, 2023

Related U.S. Application Data

(63) Continuation of application No. 16/682,501, filed on Nov. 13, 2019, now Pat. No. 11,525,846, which is a (Continued)

(30) Foreign Application Priority Data

May 16, 2017 (GB) ..................................... 1707845

(51) Int. Cl.
*G01R 25/00* (2006.01)
*G01R 19/00* (2006.01)
(Continued)

(52) U.S. Cl.
CPC ..... *G01R 19/003* (2013.01); *G01R 19/16504* (2013.01); *G01R 19/16566* (2013.01); *G01R 27/14* (2013.01)

(58) Field of Classification Search
CPC .... G01R 27/14; G01R 19/003; G01R 19/165; G01R 19/16504; G01R 19/16566
See application file for complete search history.

(56) References Cited

U.S. PATENT DOCUMENTS 4,556,847 A 12/1985 Aspiotis et al.
9,520,894 B1 * 12/2016 Liaghati .................. H03M 3/04
(Continued)

FOREIGN PATENT DOCUMENTS

FR 2645968 A1 10/1990

OTHER PUBLICATIONS

International Search Report dated Sep. 17, 2018 for PCT Application No. PCT/GB2018/051296.
(Continued)

*Primary Examiner* — Thang X Le
(74) *Attorney, Agent, or Firm* — EIP US LLP

(57) ABSTRACT

In a meter for performing a measurement of an electrical parameter, an output from a sensor is sampled to produce at least one sample, and an iterative method is performed comprising: producing further samples; holding in memory a stored array of samples comprising the at least one sample and each of the further samples from each iteration; determining a measure of statistical variability of a mean for the respective iteration from a measure of statistical variability and from the number of samples used to generate the measure of statistical variability; comparing the measure of statistical variability of the mean with a pre-determined threshold; and generating an electrical signal indicating a state of the measurement if the measure of statistical variability of the mean of the samples taken during the measurement is less than or equal to the pre-determined threshold.

18 Claims, 14 Drawing Sheets

Related U.S. Application Data continuation of application No. PCT/GB2018/051296, filed on May 14, 2018.

(51) Int. Cl.
  *G01R 19/165* (2006.01)
  *G01R 27/14* (2006.01)

(56) References Cited

U.S. PATENT DOCUMENTS

| | | |
|---|---|---|
| 2008/0172189 A1 | 7/2008 | Kadosh et al. |
| 2008/0208527 A1 | 8/2008 | Kavaklioglu |
| 2009/0143999 A1 | 6/2009 | Karthikeyan et al. |
| 2009/0192751 A1 | 7/2009 | Kamath et al. |
| 2010/0004885 A1 | 1/2010 | Nakanishi |
| 2010/0010768 A1 | 1/2010 | Good et al. |
| 2013/0158917 A1 | 6/2013 | Uchida |
| 2015/0177315 A1* | 6/2015 | Lim ............... G01R 21/10 702/108 |
| 2016/0003883 A1* | 1/2016 | Chaintreuil ......... H02H 3/16 702/58 |
| 2017/0115335 A1* | 4/2017 | Pamulaparthy ....... G01R 31/52 |
| 2019/0064307 A1 | 2/2019 | Danesh et al. |

OTHER PUBLICATIONS

Combined Search and Examination Report dated Aug. 15, 2017 for GB 1707845.2.
United States Ex Parte Quayle Action dated Jun. 14, 2022 for U.S. Appl. No. 16/682,501.
United States Notice of Allowance dated Aug. 15, 2022 for U.S. Appl. No. 16/682,501.

* cited by examiner

METER FOR MEASURING AN ELECTRICAL PARAMETER

CROSS-REFERENCE TO RELATED APPLICATIONS

This application is a continuation under 35 U.S.C. § 120 of U.S. Ser. No. 16/682,501 filed Nov. 13, 2019 which is a continuation of International Application No. PCT/GB2018/051296, filed May 14, 2018, which claims priority to GB Application No. GB1707845.2, filed May 16, 2017, under 35 U.S.C. § 119(a). Each of the above-referenced patent applications is incorporated by reference in its entirety.

BACKGROUND OF THE INVENTION

Technical Field

The present invention relates generally to improved test apparatus for measuring one or more electrical parameters, and more specifically, but not exclusively, to a hand-held digital meter capable of measuring resistance in an electrically noisy circuit.

Background

Conventional meters for measuring an electrical parameter such as resistance may be used in an electrically noisy environment. Typically, an extended measurement period may be used to produce an averaged value of the electrical parameter, to reduce the effects of electrical noise. Typically, an operator may perform several measurements in order to gain confidence that a measurement is reliable. However, this may be time-consuming and onerous on the user and the result may be uncertain.

SUMMARY

In accordance with a first aspect of the present invention, there is provided a method of operation of a meter for performing a measurement of an electrical parameter, the method comprising, in the meter: sampling an output from a sensor of the electrical parameter to produce at least one sample; and iteratively performing steps of: sampling the output from the sensor to produce one or more further samples; holding in memory a stored array of samples comprising the at least one sample and each of the one or more further samples from each iteration; determining a measure of statistical variability from the stored array of samples for the respective iteration; determining a measure of statistical variability of a mean for the respective iteration from the measure of statistical variability and from the number of samples used to generate the measure of statistical variability; comparing the measure of statistical variability of the mean with a pre-determined threshold; and generating an electrical signal indicating a state of the measurement if the measure of statistical variability of the mean of the samples taken during the measurement is less than or equal to the pre-determined threshold.

This allows a measurement to be made reliably and efficiently.

In an embodiment of the invention, the electrical signal indicating a state of the measurement indicates that the measurement has reached or exceeded a target confidence level.

In an embodiment of the invention, the electrical signal indicating a state of the measurement indicates that the measurement is complete.

In an embodiment of the invention, measure of statistical variation is a standard deviation.

In an embodiment of the invention, the measure of statistical variation is a variance.

In an embodiment of the invention, the measure of statistical variability of the mean is a standard deviation divided by the square root of the number of samples used to generate the measure of statistical variability.

In an embodiment of the invention, determining the measure of statistical variability from the stored array of samples comprises, at each iteration: forming a second array of samples to be held for the iteration in addition to the stored array of samples by filtering the array of samples, and calculating the measure of statistical variability of the second array of samples.

This allows efficient operation in the presence of noise.

In an embodiment of the invention, filtering the stored array of samples comprises applying a median filter.

This allows outlying samples to be discarded, reducing the effects of intermittent noise on measurement time.

In an embodiment of the invention, applying the median filter comprises: arranging the samples in the stored array of samples in order of magnitude; forming the second array of samples from the stored array of samples by discarding at least a sample with greatest magnitude.

This allows reliable operation in the presence of noise.

In an embodiment of the invention, forming the second array of samples from the stored array of samples comprises discarding a sample with greatest magnitude and a sample with least magnitude.

This allows reliable operation in the presence of noise.

In an embodiment of the invention the method comprises: calculating an average measurement of the electrical parameter at each iteration from the second array of samples; and generating an output indicating the average measurement.

This allows a user-friendly interface to be provided.

In an embodiment of the invention, the method comprises: generating an output indicating confidence of the measurement at each iteration from the measure of statistical variability of the mean and a target measure of statistical variability of the mean.

This allows a user-friendly interface to be provided.

In an embodiment of the invention, the output indicating confidence of the measurement represents a percentage of a target confidence level.

This provides a convenient indication of confidence level.

In an embodiment of the invention, the method comprises: determining a time-to-finish estimate for the measurement from the measure of statistical variability; and generating an output indicating the determined time-to-finish estimate.

This provides an efficient user interface for the meter, allowing an efficient measurement to be performed.

In an embodiment of the invention, generating the output indicating the determined updated time-to-finish estimate comprises: calculating an average of said determined time-to-finish estimate and at least some of previously determined time-to-finish estimates This allows a reliable estimate of confidence level to be provided.

In an embodiment of the invention, each said output is a digital control to a display.

In an embodiment of the invention, the method comprises stopping the measurement in response to the electrical signal indicating a state of the measurement.

This allows efficient automatic operation of the meter.

According to a second aspect of the invention there is provided a meter for performing a measurement an electrical parameter, comprising:

a sensor configured to measure the electrical parameter;
a processor configured to perform the method of the invention.

Further features and advantages of the invention will be apparent from the following description of exemplary embodiments of the invention, which are given by way of example only.

DETAILED DESCRIPTION OF CERTAIN INVENTIVE EMBODIMENTS

By way of example, embodiments of the invention will now be described in the context of a hand-held digital meter capable of measuring resistance of an electrical component or circuit, but it will be understood that embodiments of the invention may relate to other electrical test equipment and that embodiments of the invention are not restricted to use in a hand-held digital meter or to measurement of resistance.

Figure 1:
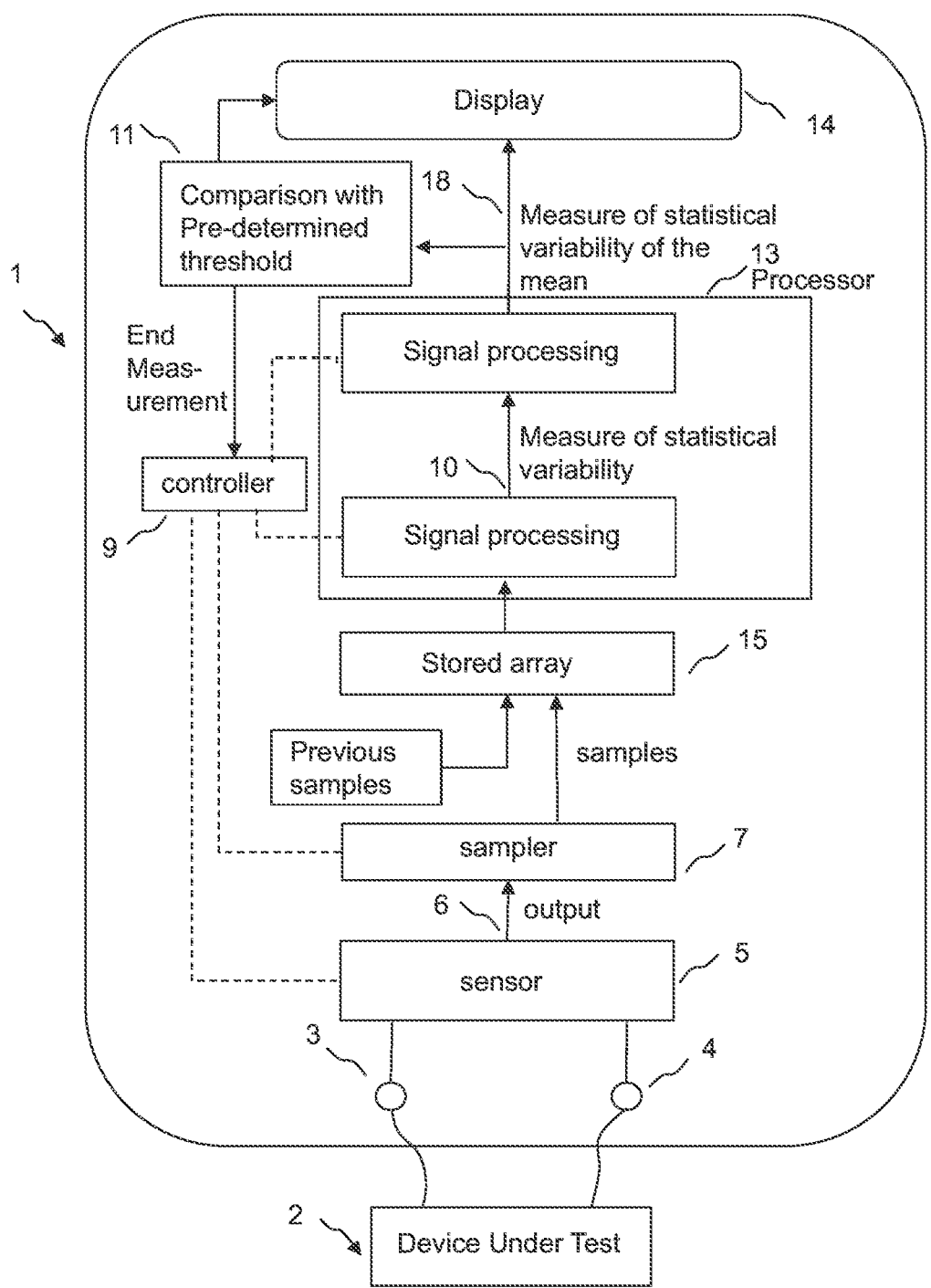
FIG. 1 is a schematic diagram illustrating test apparatus according to an embodiment of the invention, connected to an electrical component.

FIG. 1 shows test apparatus 1 according to an embodiment of the invention, in this example a hand-held digital meter, connected to an electrical device 2, for testing of the resistance of the electrical device 2. The meter has a first terminal 3 and a second terminal 4 for connection to the electrical device under test. The meter also has a sensor 5, operating as a measurement circuit, connected to the first 3 and second 4 terminals. The measurement circuit may not necessarily be directly connected to the first and second terminals, but may be connected via other components, for example an input protection circuit, which may comprise, for example, a series arrangement of one or more positive temperature coefficient resistors and/or high current resistors and/or fuses. The measurement circuit typically has a high input impedance so as not to disturb the circuit under test when it is connected. The measurement circuit, when measuring resistance, may operate as a high input impedance voltmeter connected across the first and second terminals, with a current source arranged to drive a known current through the electrical component under test. The sensor may be controlled by a control circuit or controller 9. The control circuit may comprise, for example, a microcontroller having program memory containing program code, or the controller may be part of another processor or may be implemented by digital logic or by a programmable gate array. The functions of the control circuit and a processor 13 for performing signal processing may be combined as one or more controller or processor circuits, and may be performed by software or firmware configured to run on a programmable device.

As shown in FIG. 1, an output of the sensor is sampled by a sampler 7 to produce samples. A signal processor circuit or signal processing operation of a processor 13 determines a measure of statistical variability 10 of the samples, and a further signal processor circuit or signal processing operation determines a measure of the statistical variability of the mean from the measure of statistical variability and from the number of samples used to generate the measure of statistical variability. The measure of statistical variability of the mean is compared with a pre-determined threshold, and, if the measure of statistical variability of the mean is less than or equal to the pre-determined threshold, an electrical signal is generated indicating a state of the measurement, such as an indication that the measurement complete. The electrical signal may be an analogue or digital signal causing a display 14, for example a liquid crystal display of the meter, to display an indication of the status of the measurement, for example an indication that the measurement is complete, and/or an indication that the measurement has reached or exceeded a pre-determined confidence level. This allows an improved user interface for a meter, allowing a more efficient measurement operation to be performed.

The measure of statistical variability may be, for example, a standard deviation, and the measure of statistical variability of the mean may be the standard deviation divided by the square root of the number of samples used to generate the measure of statistical variability. In an alternative embodiment, the measure of statistical variability may be a variance.

The state of the measurement indicated by the electrical signal may be completion of the measurement, and may be readiness of the measurement, for example within a pre-determined tolerance.

Figure 2:
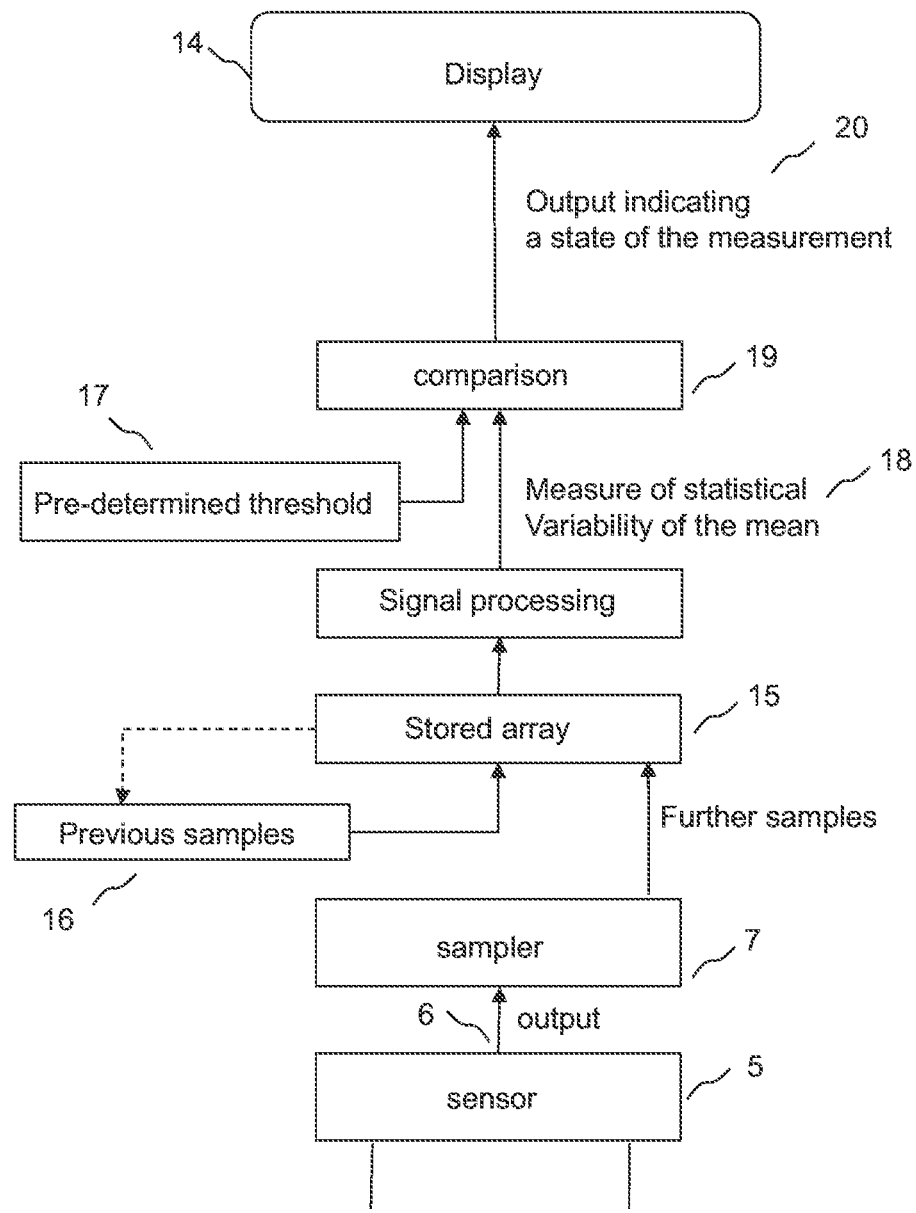
FIG. 2 is a schematic diagram illustrating test apparatus according to an embodiment of the invention, illustrating generating an output indicating a state of the measurement.

As shown in FIG. 2, the following steps may be iteratively performed: sampling the output from the sensor to produce one or more further samples, holding in memory a stored array of samples 15 comprising the previous samples 16 and each of the one or more further samples from each iteration, determining a measure of statistical variability of the mean from the stored array of samples, and comparing a measure of statistical variability of a mean 18 determined from the stored array of samples in a comparison circuit or programmed step 19 with a pre-determined threshold 17. The comparison may generate an output 20 in the form of an electrical signal indicating a state of the measurement, which may be an indication that the measurement is complete, if the measure of statistical variability of the mean of the samples taken during the measurement is less than or equal to the pre-determined threshold. The output may cause the display to show an indication that the measurement is complete, and the measurement process may be stopped.

Figure 3:
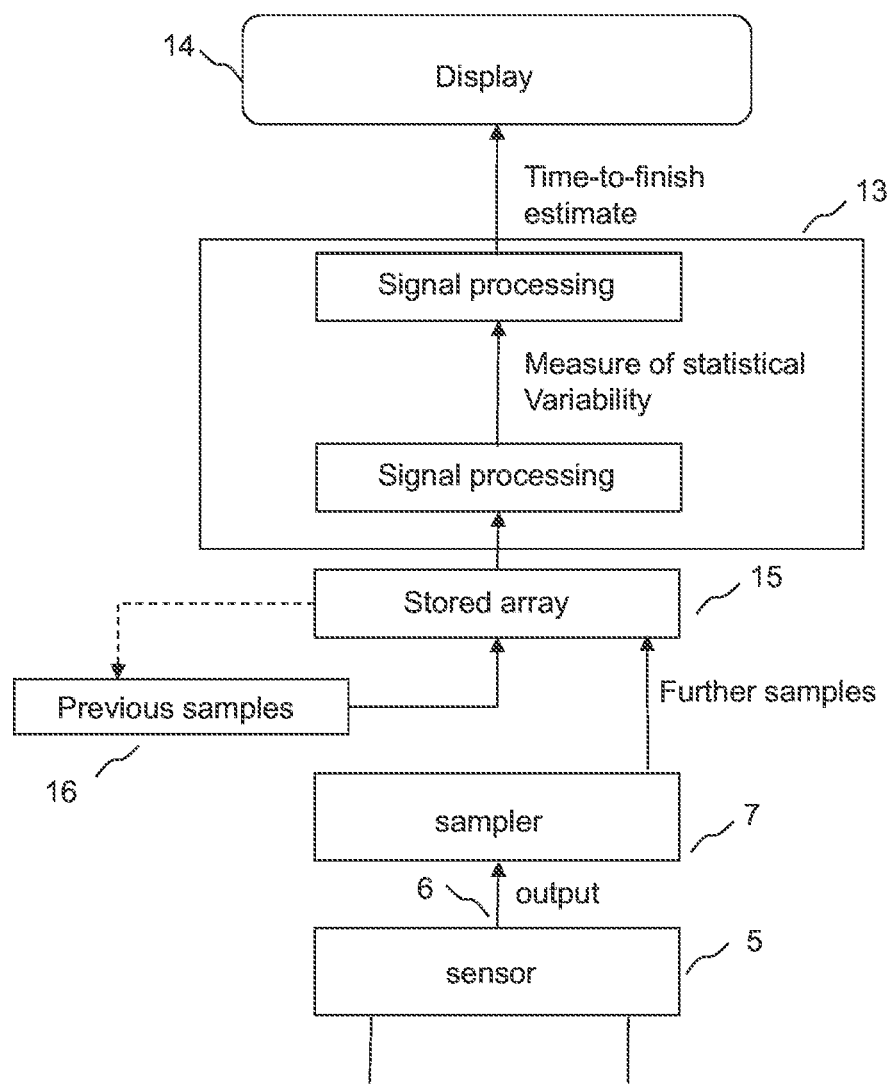
FIG. 3 is a schematic diagram illustrating test apparatus according to an embodiment of the invention, illustrating generation of a time-to-finish estimate.

FIG. 3 shows determining a time-to-finish estimate for the measurement from the measure of statistical variability and generating an output to indicate the determined updated time-to-finish estimate. This allows a continually updated estimate of time-to-finish to be provided. The time to finish estimate may be derived from the estimated number of samples to finish, which may be derived from the measure of statistical variability and a target confidence level. As described in more detail in connection with FIG. 8, the estimated number of samples to finish may be given by the square of the result of the division of the measure of statistical variability, in the form of standard deviation, by a target confidence level.

Figure 4:
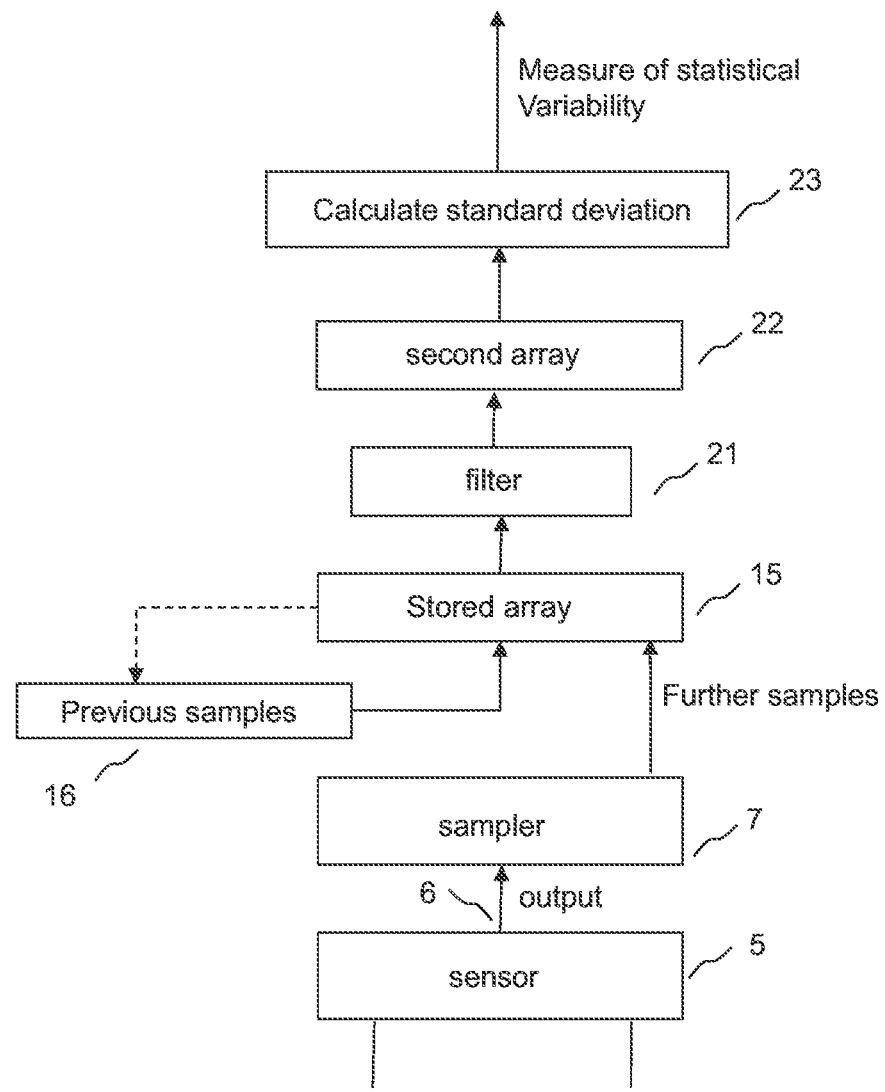
FIG. 4 is a schematic diagram illustrating test apparatus according to an embodiment of the invention, illustrating generation of a second array of samples by filtering the stored array of samples.

As shown in FIG. 4, an updated measure of statistical variability may be generated from the stored array of samples by, at each iteration, forming a second array of samples 22 to be held for the iteration in addition to the stored array of samples by filtering the array of samples in a filter 21, and calculating 23 a standard deviation of the second array of samples, allowing reliable operation of the meter in the presence of noise in the circuit being measured in the device under test.

Figure 5:
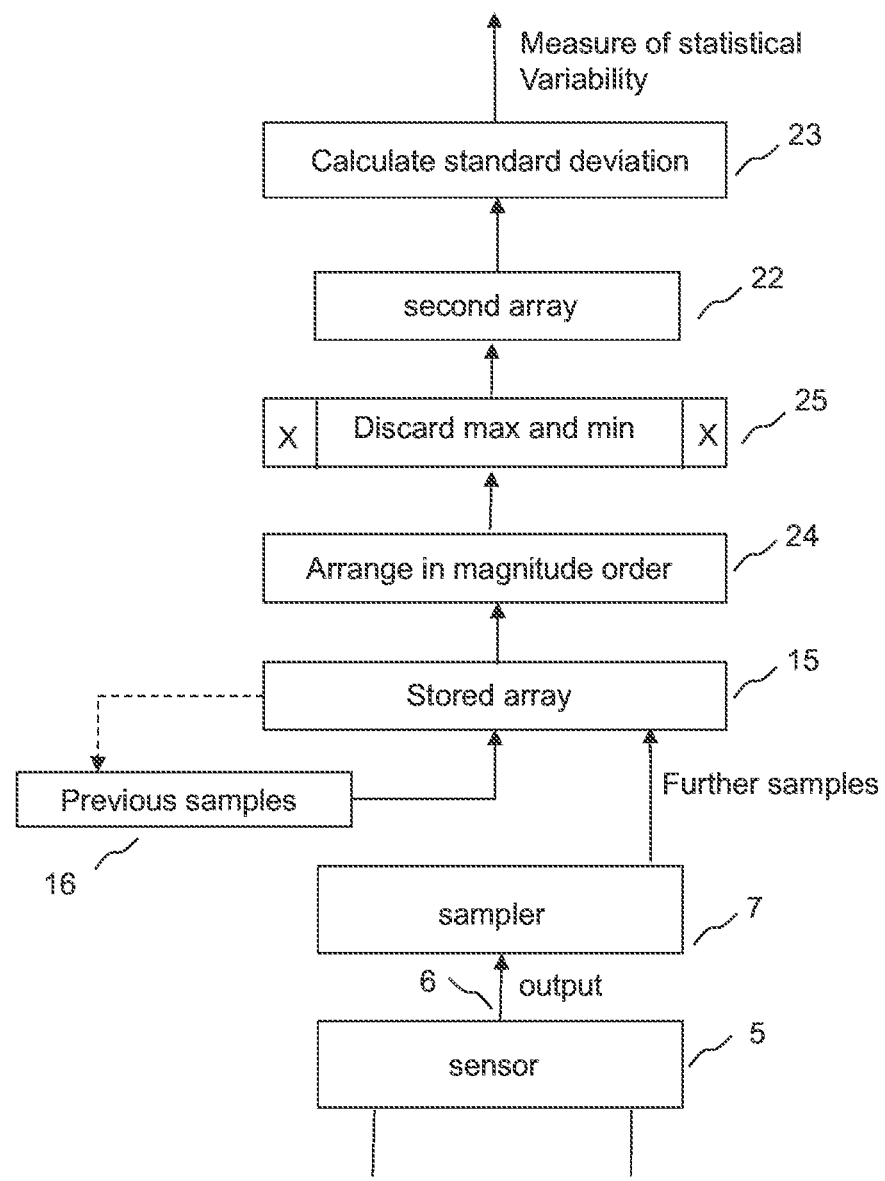
FIG. 5 is a schematic diagram illustrating test apparatus according to an embodiment of the invention, illustrating implementation of a median filter.

As shown in FIG. 5, in an embodiment of the invention, filtering the stored array of samples may comprise applying a median filter, allowing a reliable time to finish estimate to be generated. Applying the median filter comprises arranging the samples in the stored array of samples in order of magnitude 24, forming the second array of samples from the stored array of samples by discarding at least a sample with greatest magnitude, and typically also at least a sample with the least magnitude 25.

In addition, a display may be generated showing the running average of the measurements of the electrical parameter, for example resistance. This may be useful to a user of the meter. To do this, an average measurement of the electrical parameter may be calculated at each iteration from the second array of samples, and the output indicating the average measurement may be generated from this. Alternatively or in addition, an output indicating confidence of the measurement may be generated at each iteration from the updated measure of statistical variability and a target measure of statistical variability. The output indicating confidence of the measurement may represent a percentage of a target confidence level, providing a user-friendly interface providing a convenient indication of confidence level.

Updating the output to indicate the determined updated time-to-finish estimate may comprise filtering, for example, calculating an average of the updated time-to-finish estimate and at least some of previously determined time-to-finish estimates. The filtering of the previously determined time to finish estimates may be by a digital filter, such as a median filter. The output is typically a digital control to a display.

In addition to applying to measurements of resistance, embodiments of the invention can apply to other systems performing measurements of a given quantity.

In prior art systems, in order to increase accuracy of a measurement, the data is usually acquired many times and an average value is reported as a final value. However, despite filtering in hardware using, for example, analogue electronic filters and/or software, using for example averaging and/or digital filters, the output value can still fluctuate, due to the amount of noise present in the input data. For many devices such as multimeters or other specialised testers the measurement time may be pre-set, for example to 0.5 sec per screen update and each new value overwrites the previous value, so that historical data is not displayed. In the case of a large amount of noise, insufficient information may be gathered to make an accurate measurement. As a consequence the displayed result can vary wildly, which can be confusing to the operator, and may call into doubt the validity of the results.

A typical prior art approach used in practice is for an operator to take several readings and to find average of them, for example with a calculator or spreadsheet, or for example just recording the highest and the lowest reading and take average of the two. Either method requires writing down results, performing mental arithmetic, or using devices to perform the averaging. This is difficult to do in practice, as both hands can be required to hold the instrument so writing down requires a second person, time consuming and prone to mistakes. When the averaging is carried out manually it is typically unknown how many measurements should be taken to provide a reliable average, so that enough points are recorded.

Embodiments of the invention perform averaging automatically, with the number of measurements adjusted adaptively on-the-fly. The ongoing measured value is processed by statistical methods, so that the confidence in the measurement stability can be estimated. The measurement time may be extended for as long as required in order to measure the quantity with a specified confidence level. Additionally, for a given level of noise, and for a noise level which changes with time, the processing circuit can predict how many iterations it will take for the measurement to complete, so that the time-to-finish value can be predicted. This gives assurance to the operator because not only the final value will be given with high confidence, but it will also give information about the time it is required to achieve good confidence, for example 1 second or 10 minutes.

In embodiments of the invention, the averaging operation is carried out automatically, for potentially large number of measurements within the capabilities of on-board computer memory and processing power. The live averaged value may be displayed, and/or a live estimation of the confidence level. The final measured value may be displayed after the calculated confidence indicates that the measurement is within a technical specification of the instrument. The confidence level can be displayed in terms of a percentage value of the technical specification of the instrument. An indication that the measurement is complete may be displayed, for example, by displaying "100%" as a confidence level, or any other indication that the measurement is complete. In addition, live estimation or prediction of time-to-finish may be displayed. The measurement may be aborted by the operator if the predicted time-to-finish is too long, but the current average value and the estimated confidence may be given, even if they are outside of the specification level.

Embodiments of the invention may use a target value for the required level of confidence to estimate the required number of data points. Since the measurement time for each data point is typically known, which may be a fixed value in a given instrument, for example 0.5 sec, the time required to reach the required level of confidence may be estimated. The final value and/or the running average may be displayed with the estimated level of confidence.

If the target value of the confidence is reached then the measurement can be terminated automatically and the final value frozen on screen, indicating that the measurement is complete or at least ready to a predetermined tolerance. If not, the time-to-finish may be estimated and the next iteration is initiated and added to the population for statistical re-analysis. The cycle may repeat until the target value of confidence is reached, or the user aborts the test because the waiting time is unacceptably long due to the noise content. With each iteration more data is gathered and the quality of the average value improves approximately by the reciprocal of square root of N, where N is the number of points. Therefore, with a sufficient number of acquired values the target value will be reached, because N increases with each iteration, so the reciprocal of square root N typically decreases exponentially.

Figure 6A:
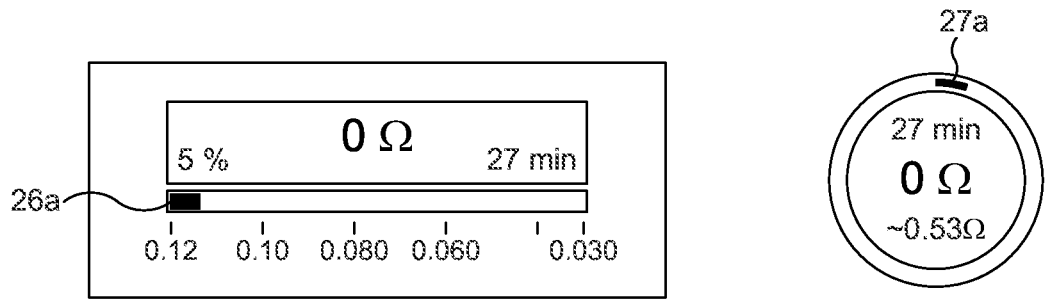
FIGS. 6a, 6b and 6c illustrate examples of displays of the output.
Figure 6B:
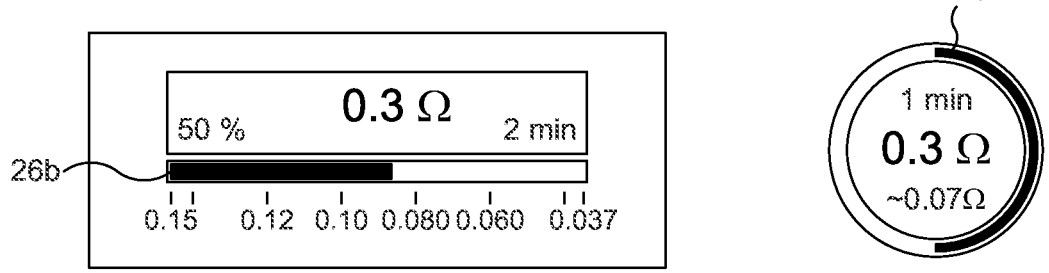
Figure 6C:
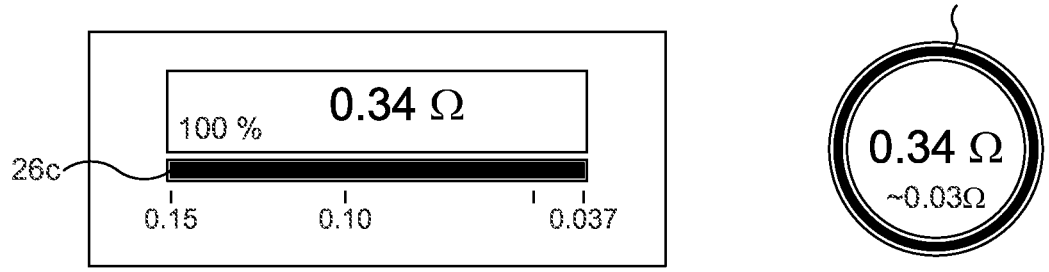

FIGS. 6a, 6b and 6c illustrate examples of displays of the output generated in embodiments of the invention at three stages of operation. Two typical examples are shown: a rectangular display with a digital scale showing confidence level, as a measure of dispersion, and/or time to finish, and a circular display with an arc showing confidence level. Colour coding may be used to indicate progress. Of course may other types of display may be implemented.

FIG. 6a shows an illustrative example of a first stage, at the start of a noisy measurement. A low confidence level 26a, 27a is shown (5%), a long predicted time (27 minutes) and the displayed average value of the measured electrical parameter is truncated, because the dispersion is greater than +/−0.5.

FIG. 6b shows a mid point of a long measurement, with 50% confidence level 26b, 27b, 2 minutes waiting time, and the displayed value showing one digit after the decimal point.

FIG. 6b shows a finished measurement with 100% confidence level 26c, 27c and full resolution of the displayed value, indicating that the measurement is complete.

The display may indicate the state of the measurement, for example that the measurement is complete, by, for example, a change of colour, display of a message, or by other suitable means. An audio signal may be generated on the basis of the electrical signal to indicate the state of the measurement, such as to indicate that the measurement is ready and/or complete.

The measurement time may be adjusted on-the-fly in an adaptive way. If the measurement starts with lower noise, and then larger noise appears, or even a single glitch, then the confidence level is automatically reduced on the basis of statistical analysis, which automatically increases the time required to complete the measurement. If initially the noise is high and reduces during measurement, then the confidence level will be improved much more quickly, thus reaching the target value in a shorter time. This happens automatically, without any user intervention.

Figure 7:
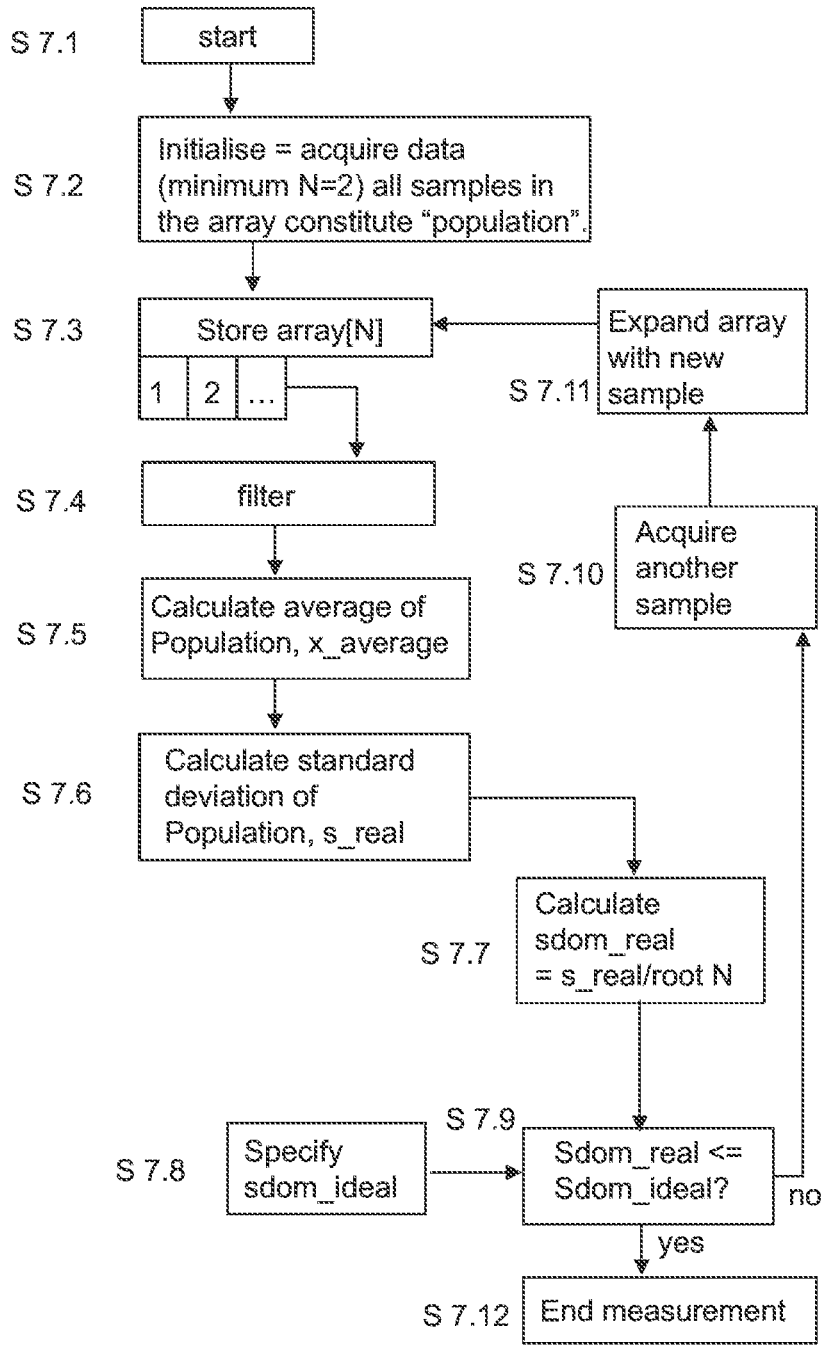
FIG. 7 is a flow diagram of operation of test apparatus according to an embodiment of the invention.

FIG. 7 is a flow diagram of operation of test apparatus according to an embodiment of the invention in steps S7.1 to S7.12. Three main values can be produced: the current average value, which may be a running or moving average, estimated iteratively at S7.5, a value corresponding to the current uncertainty of the measurement, estimated at S7.7, and a target value corresponding to technical specification of the measurement of the instrument. The actual values used for calculating the target specification can be different from those specified for the instrument. For example, a safety margin could be provided, for example 2×, so that the produced average result is sufficiently stable, so that other measurement errors due to offsets, temperature, etc., would not take the value outside of the full specification. As shown in FIG. 7, the quantity sdom_real is calculated at step S7.7, which is the standard deviation of the mean, which indicates the quality of the average value.

Figure 8:
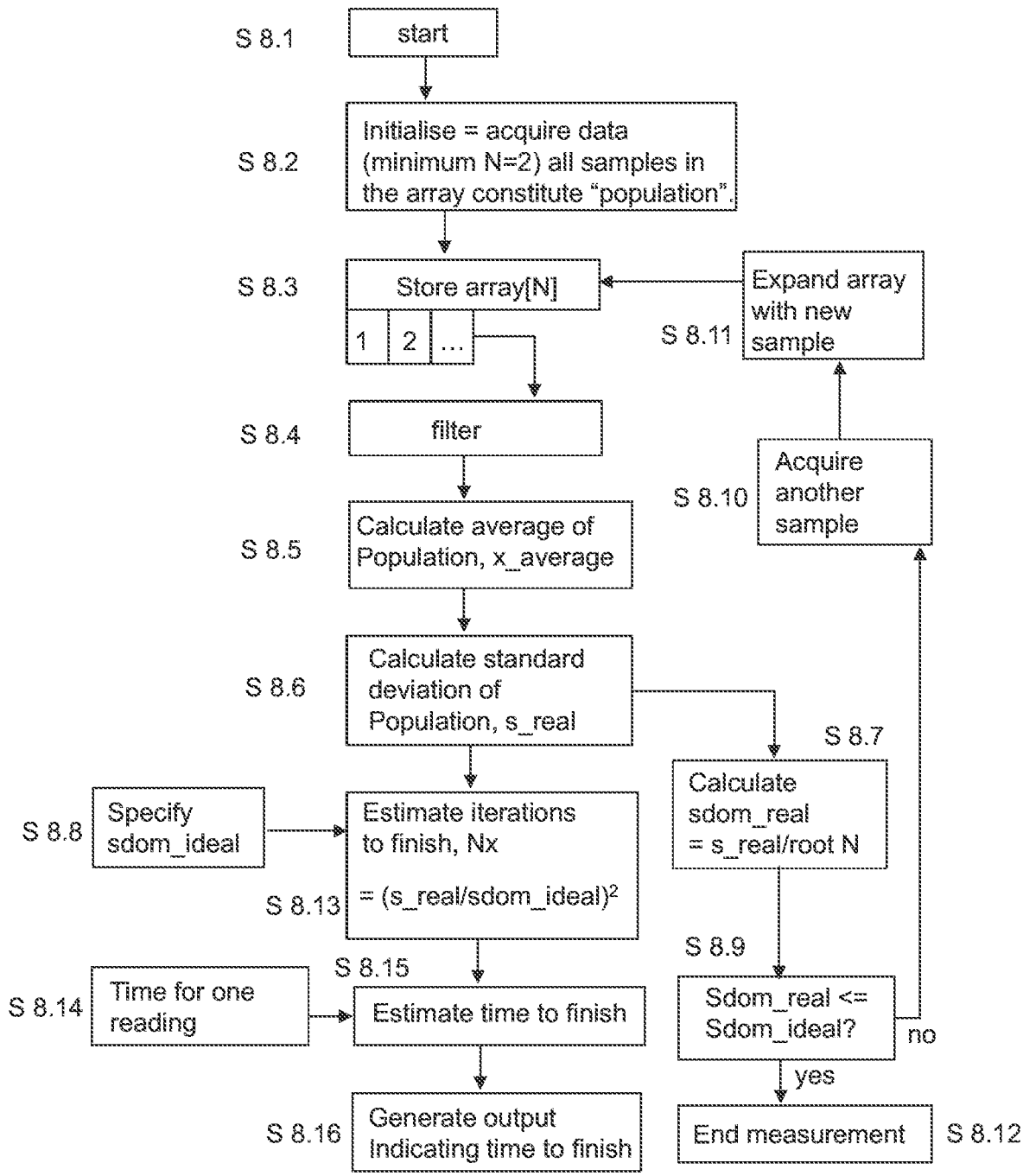
FIG. 8 is a flow diagram of operation of test apparatus according to an embodiment of the invention generating a time-to-finish estimate.

As shown in the embodiment of FIG. 7, a target confidence level sdom_ideal is specified or estimated. This can be achieved by giving a fixed value, or a value related to the measured number, for example not greater then +/−5% of the measured value. The target value is the threshold which dictates when the algorithm will stop. A running average x_average is estimated at step S7.5, and this value may be indicated by the display to the operator. The last value of the measurement may be indicated to the user, or stored in the memory. The standard deviation of the population, s_real, is estimated at step S7.6, which allows measuring the quality of the average value, also referred to as a measure of the statistical variation of the mean or sdom_real. The comparison between the target confidence value and the real confidence value may determine when the algorithm will stop. The number of iterations to finish or the time-to-finish may be estimated, as shown in FIG. 8. This provides a helpful indication to the operator.

The following equations may be used for the features of FIGS. 7 and 8:

(1) x_average (also called mean) value of the N population of $x_i$ $$\bar{x} = \frac{1}{N} \sum_{i=1}^{N} x_i$$

(2) variance ($s^2$) is dispersion of population around its mean $$s^2 = \frac{1}{N-1} \sum_{i=1}^{N} (\bar{x} - x_i)^2$$

(3) s_real, standard deviation (s, sd, stdev), is a square root of variance $$s = \sqrt{s^2} = \sqrt{\frac{1}{N-1} \sum_{i=1}^{N} (\bar{x} - x_i)^2}$$

(4) standard deviation of the mean (sdom_real) gives information about likelihood that the mean value is close to the "true" value represented by the population of all measurements Both variance and standard deviation measure dispersion of the population around the mean value. The value of sdom_real in FIG. 7 may be equal to sdom given by the following equation.

$$sdom = \frac{s}{\sqrt{N}}$$

It can be seen that equations (2) and (3) are directly related to each other and all calculations can be carried out either in terms of standard deviation or variance. Standard deviation is typically used, because it is easier to understand, because the results can be expressed in the same units as the measured results. For example if measurement is in Ω then also the dispersion measured by standard deviation can be expressed in Ω. However, it can be also expressed in relative units, for example %.

FIG. 8 is a flow diagram showing an embodiment of the invention in which an output indicating time to finish is generated. As shown in FIG. 8, this may be in addition to the features of FIG. 7.

As shown in FIG. 8, number of total points to finish may be given by $$N_x = \left(\frac{s_{real}}{sdom_{ideal}}\right)^2$$

Estimated total time to finish is number of point to finish scaled by the time of one point time_tot=const·$N_x$ Time-to-finish is calculated by subtracting the elapsed time from the total time time_to_finish=time_tot−time_elapsed The equation for standard deviation could be replaced by one with unbiased statistical variance.

Figure 9A:
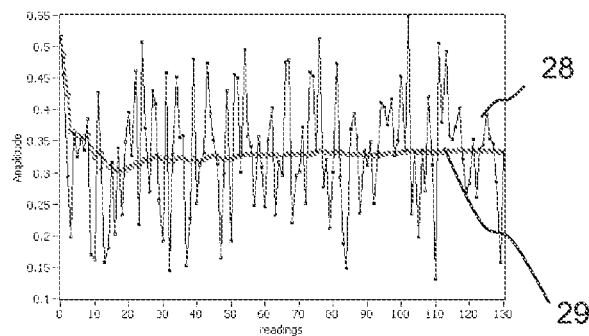
FIGS. 9a to 9e are graphs illustrating operation of the test apparatus in an electrically noisy environment.
Figure 9B:
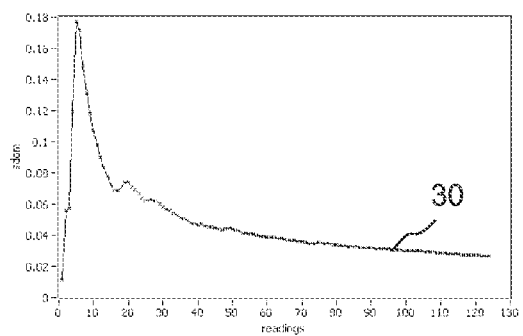
Figure 9C:
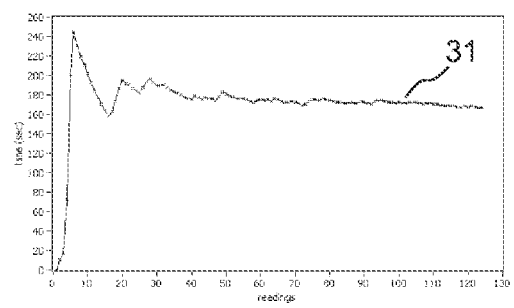
Figure 9D:
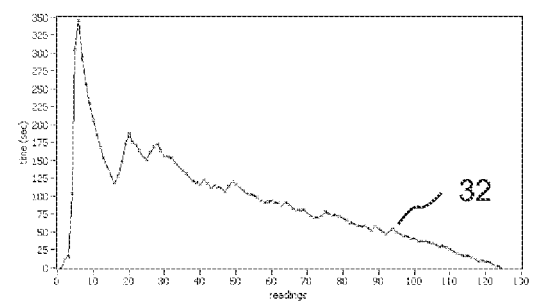
Figure 9E:
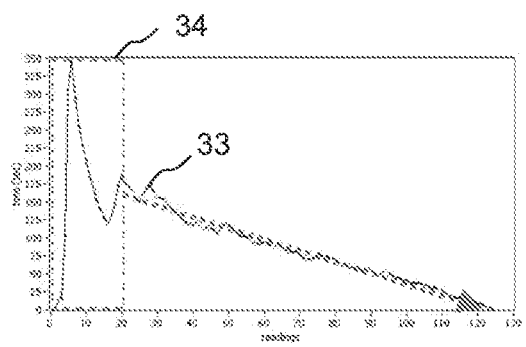

FIGS. 9a to 9e show an example of the performance of the system shown in FIG. 7 and FIG. 8 with a real measurement with fairly constant noise. FIG. 9a shows noisy readings 28 and their running average 29. FIG. 9b shows exponentially decaying values of sdom_real 30. FIG. 9c shows estimated total time 31 for the whole measurement. FIG. 9d shows estimated time-to-finish 32 as the measurement progresses. FIG. 9e is an interpretation of the curve shown in FIG. 9d. The dashed rectangle 34 shows an initial interval in which not enough points are gathered to give reliable information about dispersion of values. After about 20 readings the statistics is robust enough and the predicted time-to-finish 33 begins to linearly decrease to zero, at which point the measurement stops because the target value was reached.

FIGS. 10a to 10d show an example of adaptive performance. A fairly long measurement is shown in order to better illustrate the concept. The noise level is fairly constant, but at some point there is a large glitch which disturbs the value of the running average.

Figure 10A:
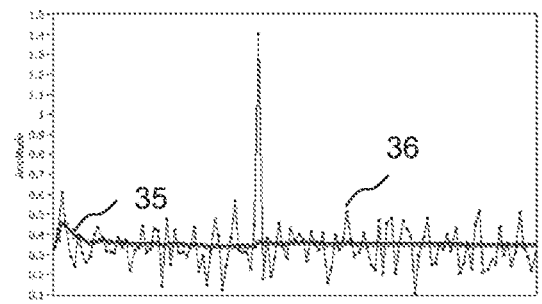
FIGS. 10a to 10d are graphs illustrating operation of the test apparatus in the presence of impulsive noise.
Figure 10B:
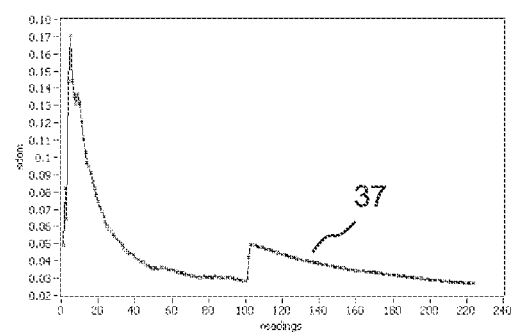
Figure 10C:
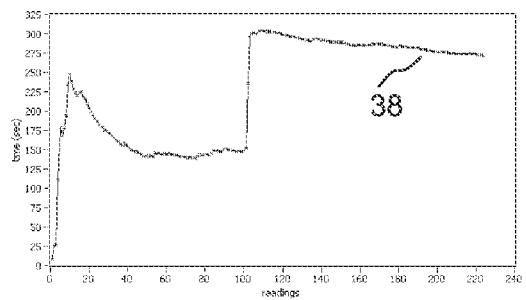
Figure 10D:
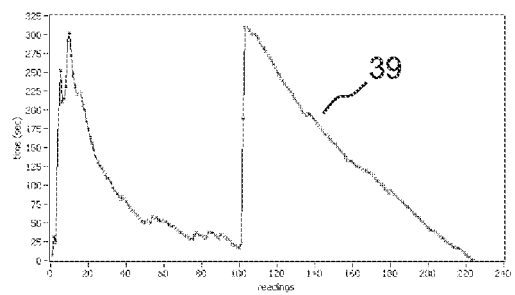

FIG. 10a shows raw input data 36, FIG. 10b shows standard deviation of mean (sdom_real) 37 detects that the mean was disturbed with the glitch shown in FIG. 10a. FIG. 10c shows the estimated total time 38 is extended accordingly and FIG. 10d shows the time-to-finish/points-to-finish 39 are adjusted automatically. Because all the data is used then this glitch is also included in the statistical evaluation and it is automatically taken into account in the estimation of confidence and time-to-finish. However, it can be clearly seen from FIG. 10d that if the glitch had not happened then the measurement would automatically terminate at much shorter time (probably around 120 readings, instead of 225).

Nevertheless, regardless the number of actual readings taken in the whole measurement the final value of the measurement has similar level of confidence within the technical specification.

The confidence of measurement can be also estimated not in terms of dispersion but as a percentage value, with the value of 100% meaning that the target value was reached. For example, assuming that the target value (target=C.CC) should be 0.12 (which is 100% confidence). One method of converting C.CC into % value could be as follows, by way of example:

1. assume or calculate target value, e.g. Cideal=0.12
2. calculate real confidence level Creal from statistical data, e.g. 0.39
3. re-map the real value to 0-100% scale Cpercent=100*Cideal/Creal=31%

Other ways of re-mapping to 0-100% scale are possible.

The algorithm does not have to be used for a single-value measurement. The same can be applied to measuring waveforms, or other signals. The waveform data can be compared to the average value and the dispersion from the average can be measured in a similar way as it is done for standard deviation of a single-value variable. Thus, some pre-processing may be done before the data is fed into the algorithm, but the key nodes of the algorithm would still be used. The algorithm may be used if a trend of changing underlying values of the parameter to be measured is known. For example, for linearly changing values they could be pre-processed by linear regression so that the confidence indicator could work on the coefficients of slope and intercept of a given curve.

If the problem is approached as statistical noise suppression then the displayed value will change from 100% (infinitely high noise) to 0% (no noise) then the equation would be:

Noisepercent=100−100*Cideal/Creal=100*(1−Cideal/Creal)

As can be seen from FIGS. 10a and 10c, a single large glitch in a fairly large population of other data points is capable of doubling the time-to-finish value, which may be undesirable from the user viewpoint. If such a glitch, or a few such glitches are excluded from the whole population of data then the remaining noise in the data is significantly smaller and the time-to-finish is significantly shorter. This is because a value of standard deviation (s_real) is affected by the noise and the glitch. If the glitch is excluded then the value of s_real is significantly reduced and the algorithm converges more quickly In an embodiment of the invention, a median filter may be utilized as shown in FIG. 5.

Typically, in a median filter, the old data is discarded and only the new data is retained for further processing. By contrast, in embodiments of the invention, the old data is retained, and the truncated mean filtering is re-applied to the full set of data on each step, because the input array will continue to grow with each iteration.

Figure 11A:
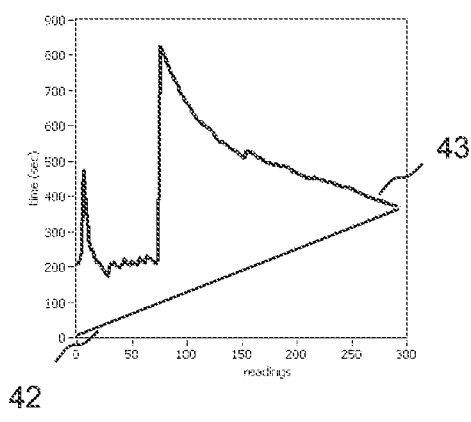
FIGS. 11a and 11b show effect of smoothing of time-to-finish estimation.
Figure 11B:
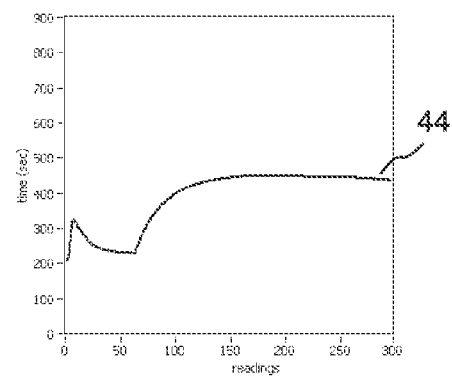

FIGS. 11a and 11b show the effect of smoothing of the time-to-finish estimation. The estimated time-to-finish value 43 can fluctuate sharply due to noise in the input data. The elapsed time is shown as straight line 42. Fluctuation may be frustrating for the operator relying on the time-to-finish value. In order to reduce such fluctuations a running average can be employed to reduce variations, as shown in curve 44.

This would require storing the previous values of time-to-finish at each iteration, and calculating an average of such whole set, or an average of its subset, e.g. the last 50% items in it, before the time-to-finish value is displayed.

Figure 12:
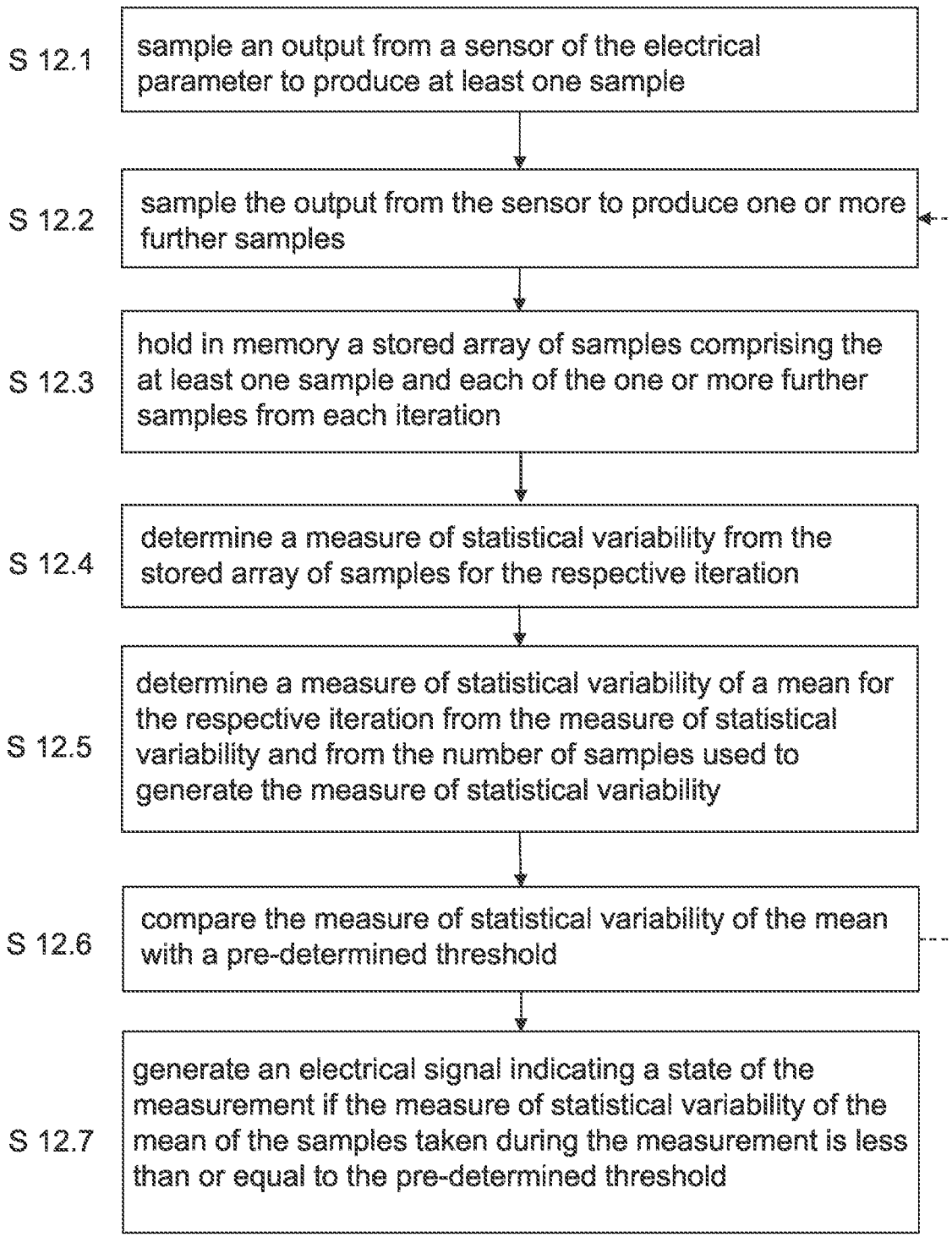
FIG. 12 is a flow diagram showing operation of the test apparatus in an embodiment of the invention.

FIG. 12 is a flow diagram showing operation of the test apparatus in an embodiment of the invention in steps S 12.1 to S12.7.

Figure 13:
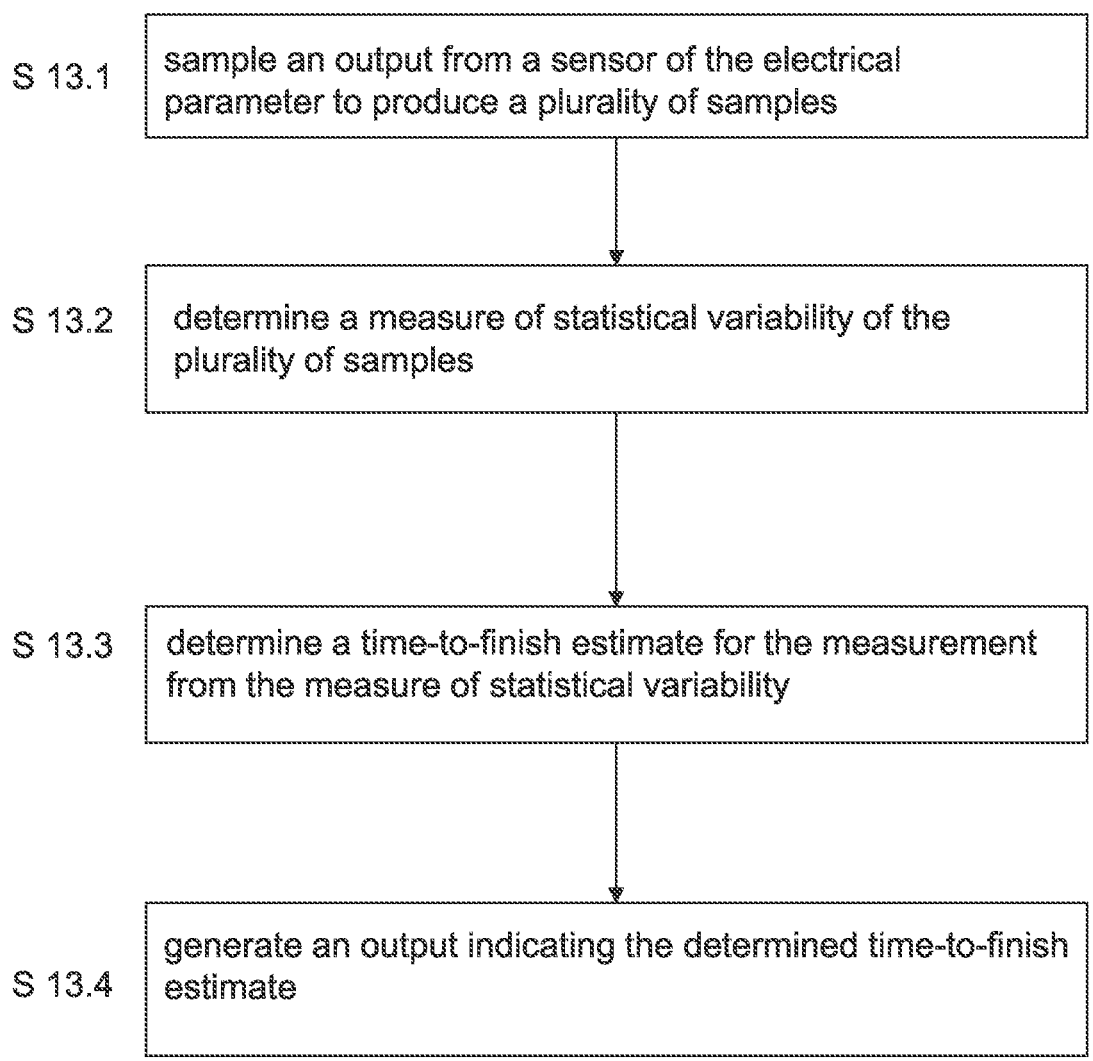
FIG. 13 is a flow diagram showing operation in an alternative arrangement.

FIG. 13 is a flow diagram showing operation of the test apparatus in an alternative arrangement in steps S13.1 to S13.4.

In some arrangements, some or all of the signal processing functions may be performed in a processor in an external network, for example being performed in the cloud. In this case the controller and/or processor would be in communication with the external network to send the data, for example the samples, for signal processing and to receive the results of the signal processing.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method of operation of a meter for performing a measurement of an electrical parameter, the method comprising, in the meter:
    sampling an output from a sensor of the electrical parameter to produce at least one sample; and
    iteratively performing steps of:
        sampling the output from the sensor to produce one or more further samples;
        processing the at least one sample and each of the one or more further samples to generate a plurality of processed samples;
        holding in memory a stored array of processed samples for each iteration;
        determining a measure of statistical variability from the stored array of processed samples for the respective iteration;
        determining a measure of statistical variability of a mean of the processed samples for the respective iteration from the measure of statistical variability and from the number of samples used to generate the measure of statistical variability;
        comparing the measure of statistical variability of the mean of the processed samples with a pre-determined threshold; and
        generating an electrical signal indicating a state of the measurement if the measure of statistical variability of the mean of the processed samples is less than or equal to the pre-determined threshold,
        wherein said processing comprises processing the at least one sample and each of the one or more further samples to derive a curve describing a trend and each processed sample represents a difference between the respective sample and the curve.

2. A method according to claim 1, wherein the electrical signal indicating a state of the measurement indicates that the measurement has reached or exceeded a target confidence level.

3. A method according to claim 1, wherein the electrical signal indicating a state of the measurement indicates that the measurement is complete.

4. A method according to claim 1, wherein the measure of statistical variability is a standard deviation.

5. A method according to claim 1, wherein the measure of statistical variability is a variance.

6. A method according to claim 1, wherein the measure of statistical variability of the mean is a standard deviation divided by the square root of the number of samples used to generate the measure of statistical variability.

7. A method according to claim 1, wherein determining the measure of statistical variability from the stored array of processed samples comprises, at each iteration:
    forming a second array of processed samples to be held for the iteration in addition to the stored array of processed samples by filtering the array of processed samples, and
    calculating the measure of statistical variability of the second array of processed samples.

8. A method according to claim 7, wherein filtering the stored array of processed samples comprises applying a median filter.

9. A method according to claim 8, wherein applying the median filter comprises:
    arranging the samples in the stored array of processed samples in order of magnitude;
    forming the second array of processed samples from the stored array of processed samples by discarding at least a sample with greatest magnitude.

10. A method according to claim 9, wherein forming the second array of processed samples from the stored array of processed samples comprises discarding a sample with greatest magnitude and a sample with least magnitude.

11. A method according to claim 7, comprising:
    calculating an average measurement of the electrical parameter at each iteration from the second array of processed samples; and
    generating an output indicating the average measurement.

12. A method according to claim 1, comprising:
    generating an output indicating confidence of the measurement at each iteration from the measure of statistical variability of the mean and a target measure of statistical variability of the mean.

13. A method according to claim 12, wherein the output indicating confidence of the measurement represents a percentage of a target confidence level.

14. A method according to claim 1, comprising:
    determining a time-to-finish estimate for the measurement from the measure of statistical variability; and
    generating an output indicating the determined time-to-finish estimate.

15. A method according to claim 14, wherein generating the output indicating the determined updated time-to-finish estimate comprises:
    calculating an average of said determined time-to-finish estimate and at least some of previously determined time-to-finish estimates.

16. A method according to claim 1, comprising stopping the measurement in response to the electrical signal indicating a state of the measurement.

17. A meter for performing a measurement of an electrical parameter, comprising:
    a sensor configured to measure the electrical parameter;
    a processor configured to cause the meter to:
    sample an output from a sensor of the electrical parameter to produce at least one sample; and
    iteratively perform steps of:
        sampling the output from the sensor to produce one or more further samples;
        processing the at least one sample and each of the one or more further samples to generate a plurality of processed samples;
        holding in memory a stored array of processed samples for each iteration;
        determining a measure of statistical variability from the stored array of processed samples for the respective iteration;
        determining a measure of statistical variability of a mean of the processed samples for the respective iteration from the measure of statistical variability and from the number of samples used to generate the measure of statistical variability;

comparing the measure of statistical variability of the mean of the processed samples with a pre-determined threshold; and generating an electrical signal indicating a state of the measurement if the measure of statistical variability of the mean of the processed samples is less than or equal to the pre-determined threshold, wherein said processing comprises processing the at least one sample and each of the one or more further samples to derive a curve describing a trend and each processed sample represents a difference between the respective sample and the curve.

18. The meter of claim 17, wherein the electrical signal indicating a state of the measurement indicates that the measurement has reached or exceeded a target confidence level or indicates that the measurement is complete.

* * * * *